(12) United States Patent
Rhodes et al.

(10) Patent No.: US 7,091,536 B2
(45) Date of Patent: Aug. 15, 2006

(54) ISOLATION PROCESS AND STRUCTURE FOR CMOS IMAGERS

(75) Inventors: Howard Rhodes, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 10/293,494

(22) Filed: Nov. 14, 2002

(65) Prior Publication Data
US 2004/0094784 A1    May 20, 2004

(51) Int. Cl.
*H01L 31/062* (2006.01)

(52) U.S. Cl. .............. 257/291; 257/292; 257/510; 257/E31.053

(58) Field of Classification Search ........... 257/291, 257/292, 505, 510
See application file for complete search history.

(56) References Cited

U.S. PATENT DOCUMENTS

| | | | |
|---|---|---|---|
| 6,310,366 B1 * | 10/2001 | Rhodes et al. | 257/185 |
| 6,423,993 B1 * | 7/2002 | Suzuki et al. | 257/292 |
| 6,569,700 B1 * | 5/2003 | Yang | 438/48 |
| 6,590,271 B1 * | 7/2003 | Liu et al. | 257/510 |

* cited by examiner

*Primary Examiner*—T. N. Quach
(74) *Attorney, Agent, or Firm*—Dickstein Shapiro Morin & Oshinsky LLP

(57) ABSTRACT

A barrier implanted region of a first conductivity type located below an isolation region of a pixel sensor cell and spaced from a doped region of a second conductivity type of a photodiode of the pixel sensor cell is disclosed. The barrier implanted region is formed by conducting a plurality of deep implants at different energies and doping levels below the isolation region. The deep implants reduce surface leakage and dark current and increase the capacitance of the photodiode by acting as a reflective barrier to electrons generated by light in the doped region of the second conductivity type of the photodiode.

94 Claims, 10 Drawing Sheets

ISOLATION PROCESS AND STRUCTURE FOR CMOS IMAGERS

FIELD OF THE INVENTION

The present invention relates to the field of semiconductor devices and, in particular, to high quantum efficiency CMOS image sensors.

BACKGROUND OF THE INVENTION

CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode, for transferring electron charges to a sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transference.

In a conventional CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node through a transfer transistor. The charge at the floating diffusion node is converted to a pixel output voltage by the source follower output transistor. The photosensitive element of a CMOS imager pixel is typically either a depleted p-n junction photodiode or a field induced depletion region beneath a photogate.

CMOS imaging devices of the type discussed above are generally known and discussed in, for example, Nixon et al., "256.times.256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994), the disclosures of which are incorporated by reference herein.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned diode 11 (FIG. 2). The pinned photodiode is termed "pinned" because the potential in the photodiode is pinned to a constant value when the photodiode is fully depleted. It should be understood, however, that the CMOS sensor pixel cell 10 may include a photogate or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

A cross-sectional view of the exemplary CMOS image sensor 10 of FIG. 1 taken along line 2–2' is illustrated in FIG. 2. The charge accumulating region 21 is formed as a pinned photodiode 11 which has a photosensitive or p-n-p junction region formed by a p-type layer 24, an n-type region 26 and the p-type substrate 20. The pinned photodiode 11 includes two p-type regions 20, 24 so that the n-type photodiode region 26 is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferably n-type.

Generally, in CMOS image sensors such as the CMOS image sensor cell 10 of FIGS. 1–2, incident light causes electrons to collect in region 26. A maximum output signal, which is produced by the source follower transistor having gate 50, is proportional to the number of electrons to be extracted from the region 26. The maximum output signal increases with increased electron capacitance or acceptability of the region 26 to acquire electrons. The electron capacity of pinned photodiodes typically depends on the doping level of the image sensor and the dopants implanted into the active layer.

FIG. 2 also illustrates trench isolation regions 15 formed in the active layer 20 adjacent the charge accumulating region 21. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Trench isolation regions 15 are typically formed by etching trenches into the substrate 10 to provide a physical barrier between adjacent pixels and to isolate pixels optically and electrically from one another. The trenches are etched by employing a dry anisotropic or other etching process and then are filled with a dielectric such as a chemical vapor deposited (CVD) silicon dioxide ($SiO_2$). The filled trenches are then planarized by an etch-back process so that the dielectric remains only in the trenches and their top surface remains level with that of the silicon substrate 20.

A common problem associated with the formation of the above-described trench isolation regions 15 is that, when ions are implanted in the substrate close to bottom 17 and edges or sidewalls 16 (FIG. 2) of the trench, current leakage can occur at the junction between the active device regions and the trench. In addition, the dominant crystallographic planes along the bottom 17 and sidewalls 16 of the trench isolation regions 15 have a higher silicon density than the adjacent silicon substrate and, therefore, create a high density of trap sites along the trench bottom 17 and sidewalls 16. These trap sites are normally uncharged but become charged when electrons and holes become trapped in the trap sites.

As a result of these trap sites formed along the bottom 17 and sidewalls 16 of the trench isolation regions 15, current generation near and along the trench bottom 17 and sidewalls 16 can be very high. Current generated from trap sites inside or near the photodiode depletion region causes undesired dark current.

Minimizing dark current in the photodiode is important in CMOS image sensor fabrication. Dark current is generally attributed to leakage in the charge collection region 21 of the pinned photodiode 11, which is strongly dependent on the doping implantation conditions of the CMOS image sensor. In addition and as explained above, defects and trap sites inside or near the photodiode depletion region strongly influence the magnitude of dark current generated. In sum, dark current is a result of current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

CMOS imagers also typically suffer from poor signal to noise ratios and poor dynamic range as a result of the inability to fully collect and store the electric charge collected in the region 26. Since the size of the pixel electrical signal is very small due to the collection of photons in the photo array, the signal to noise ratio and dynamic range of the pixel should be as high as possible.

There is needed, therefore, an improved active pixel photosensor for use in a CMOS imager that exhibits reduced dark current and increased photodiode capacitance. There is also needed an isolation region that (i) prevents current generation or current leakage and (ii) acts as a reflective barrier to electrons generated by light absorption in a photodiode back to the charge collection region of the photodiode of a pixel sensor cell. A method of fabricating an active pixel photosensor exhibiting these improvements is also needed, as well as an isolation technique that reduces dark current and minimizes current leakage in a pinned photodiode of a pixel sensor cell. An isolation trench that isolates a pinned photodiode of a pixel sensor cell from adjacent photodiodes is also needed.

BRIEF SUMMARY OF THE INVENTION

In one aspect, the invention provides a barrier implanted region of a first conductivity type located below an isolation region of a pixel sensor cell and spaced from a doped region of a second conductivity type of a photodiode of the pixel sensor cell. The barrier implanted region is formed by conducting a plurality of deep implants of the first conductivity type at different energies and doping levels below the isolation region. The deep implants reduce surface leakage and dark current and increase the capacitance of the photodiode by acting as a reflective barrier to electrons generated by light in the doped region of the second conductivity type of the photodiode. The invention also provides an improved isolation region with an adjacent barrier implanted region that provides a reduction in the dark current that typically occurs along the bottom and sidewalls of the trench isolation region and provides photodiode-to-photodiode isolation.

In another aspect, the invention provides a method of forming a barrier implanted region below an isolation region of a pixel sensor cell and adjacent a photodiode of the pixel sensor cell. The barrier implanted region is formed by conducting a plurality of deep implants for implanting desired dopants at various dopant concentrations and dopant energies, and below an isolation region. The barrier implanted region is formed to a thickness of about 1000 Angstroms to about 5.0 microns, more preferably of about 2000 Angstroms to about 3.5 microns.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Figure 8A:
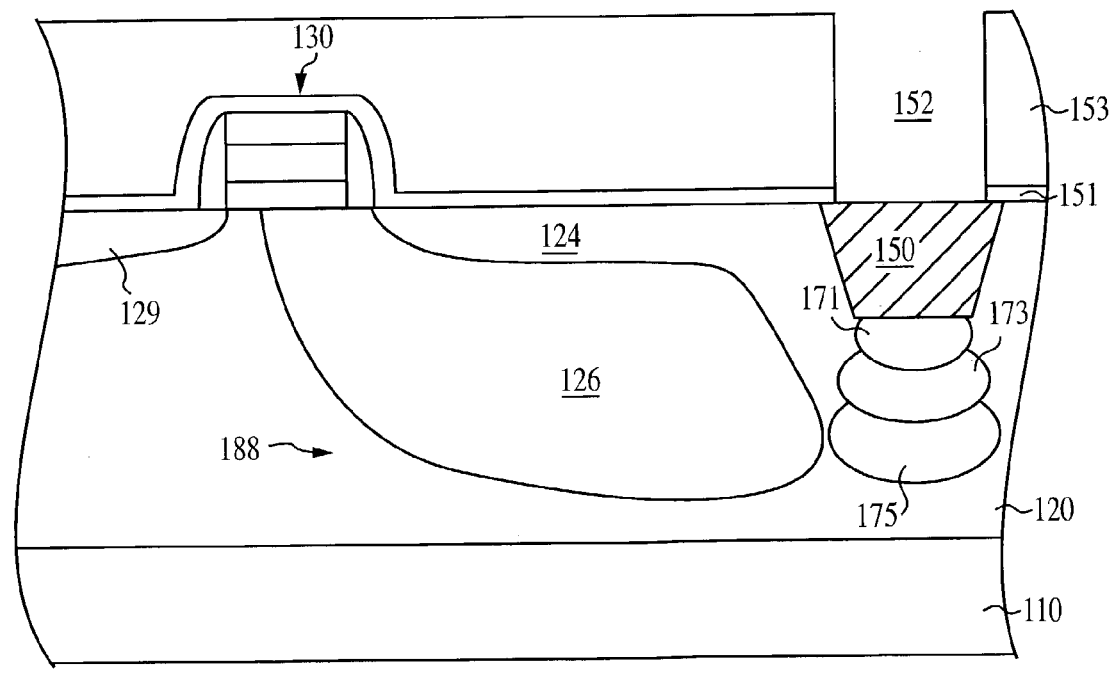
FIGS. 8(a)–(b) are schematic cross-sectional views of the CMOS image sensor pixel of FIG. 3 at a stage of processing subsequent to that shown in FIGS. 7(a)–(b).
Figure 8B:
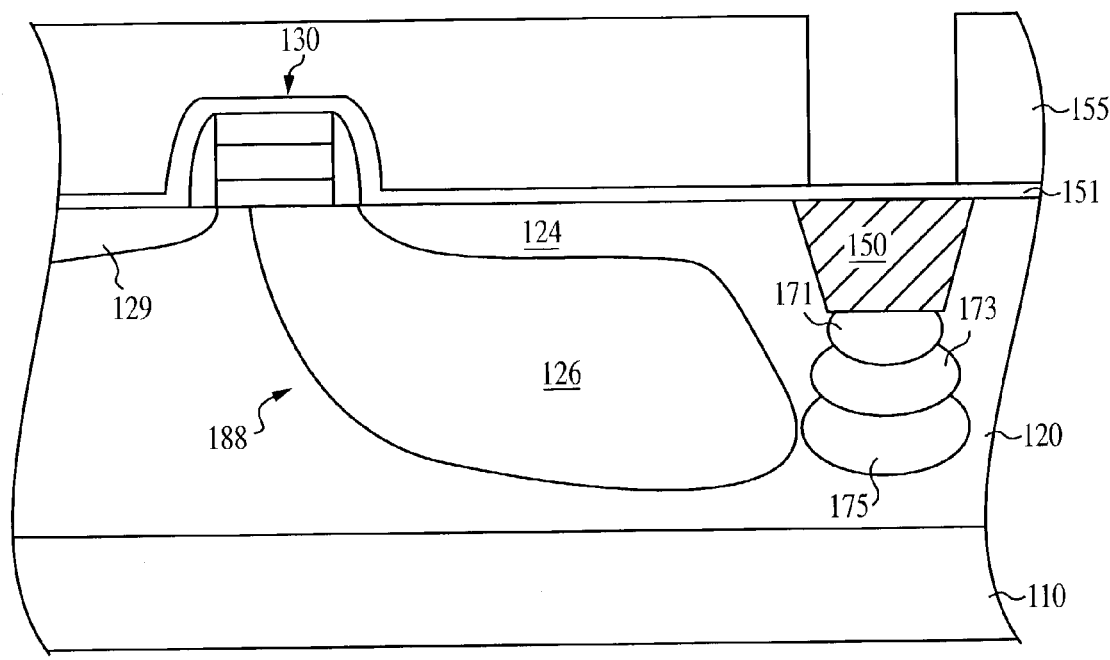
Figure 9B:
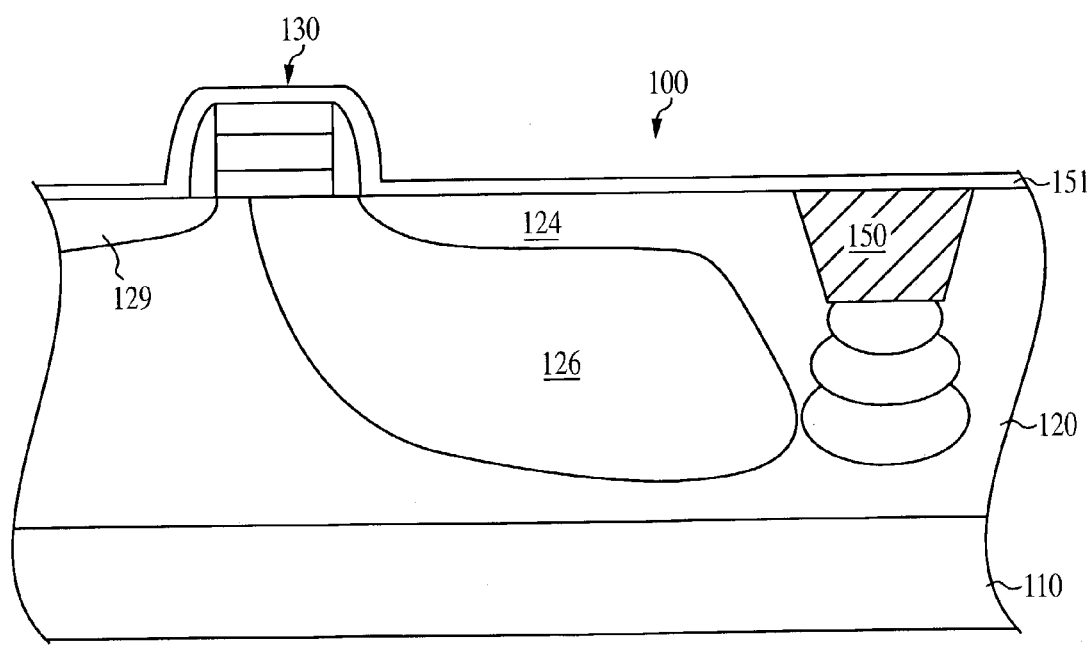
FIGS. 9(a)–(b) are schematic cross-sectional views of the CMOS image sensor pixel of FIG. 3 at a stage of processing subsequent to that shown in FIGS. 8(a)–(b).
Figure 9A:
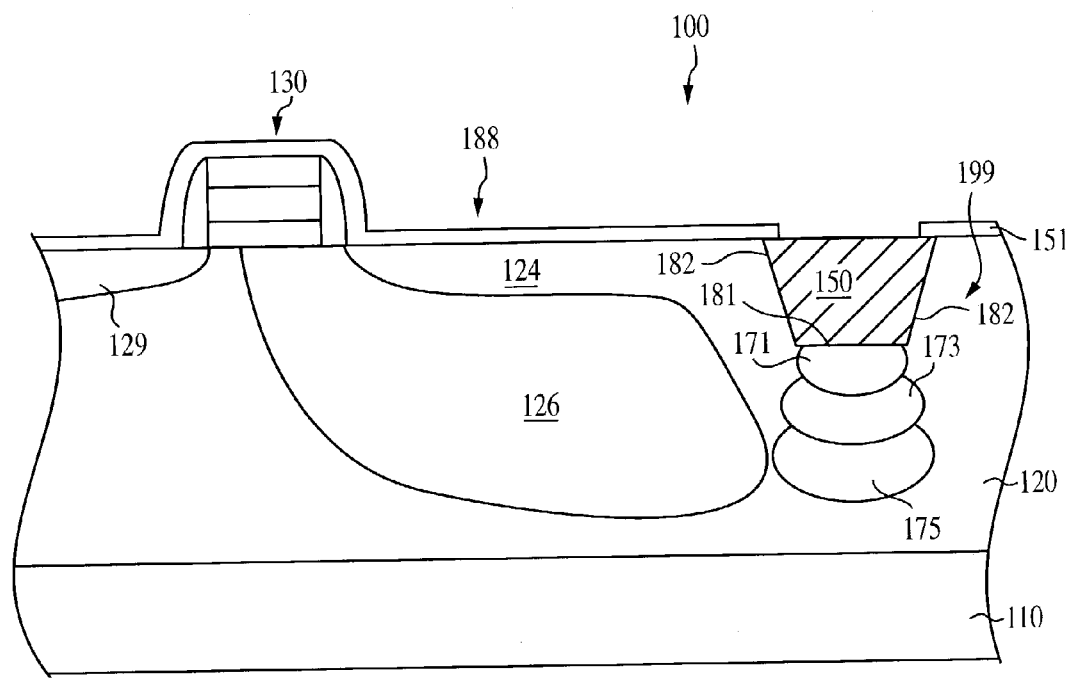
Figure 10A:
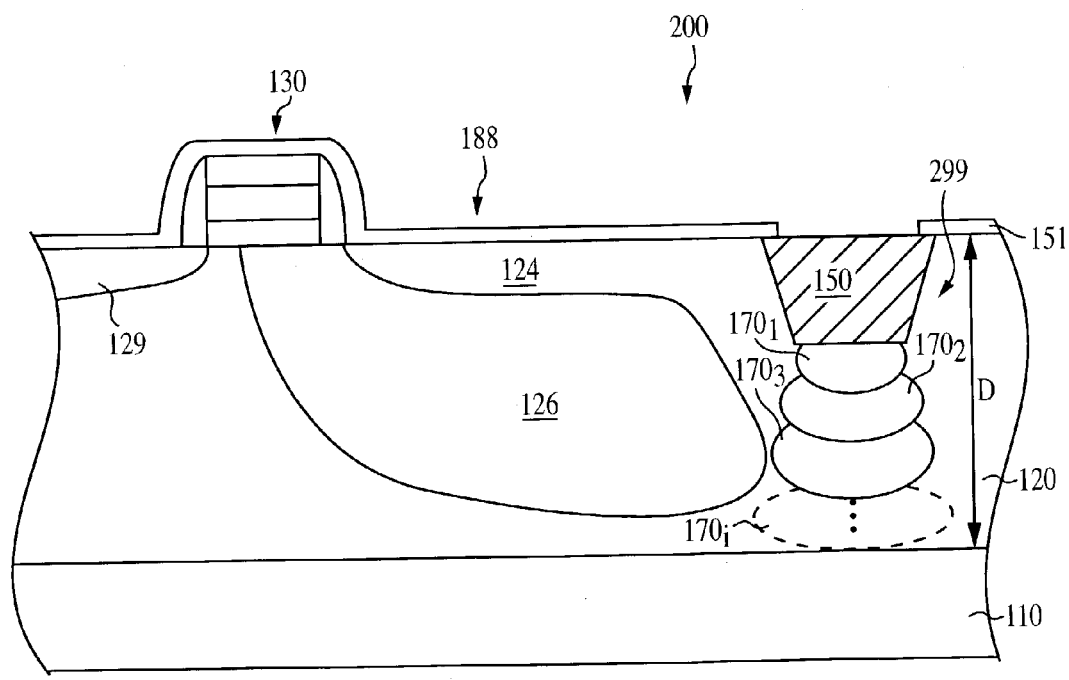
FIGS. 10(a)–(b) are schematic cross-sectional views of the CMOS image sensor pixel of FIG. 3 at a stage of processing subsequent to that shown in FIGS. 4(a)–(b) and in accordance with another embodiment of the invention.
Figure 10B:
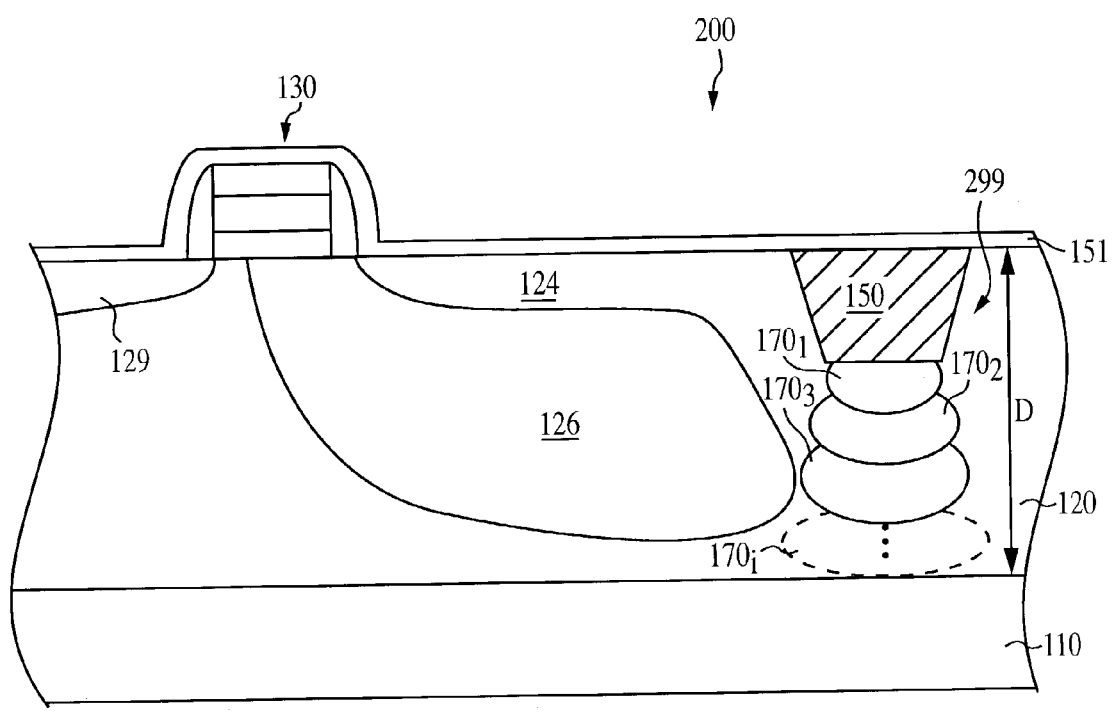
Figure 11:
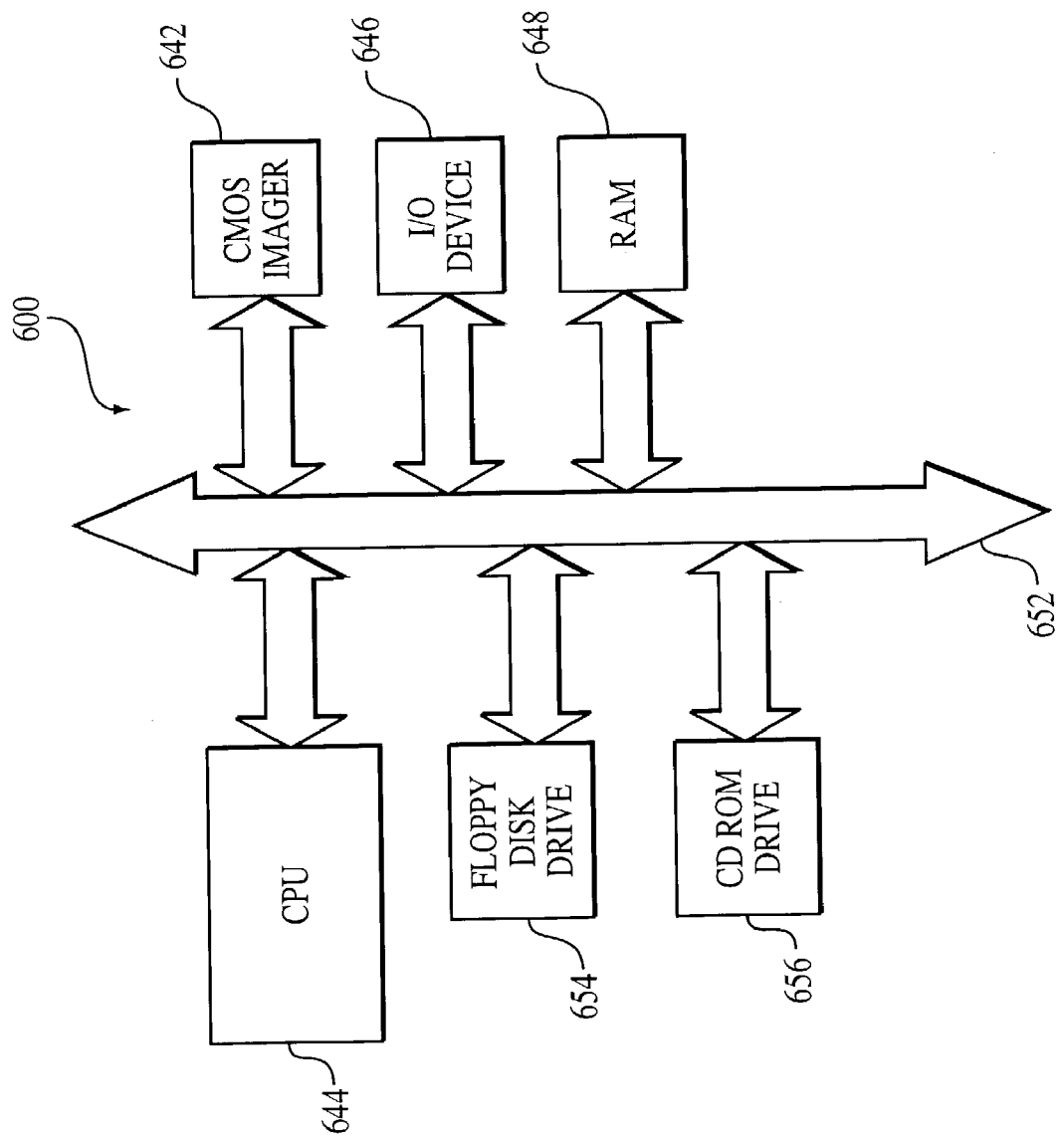
FIG. 11 illustrates a schematic diagram of a computer processor system incorporating a CMOS image sensor fabricated according to the present invention.

Referring now to the drawings, where like elements are designated by like reference numerals, FIGS. 3–10 illustrate exemplary embodiments of methods of forming four-transistor (4T) pixel sensor cells 100 (FIGS. 9(a)–(b)) and 200 (FIGS. 10(a)–(b)) having respective barrier implanted regions 199, 299 formed below an isolation region 150 and adjacent charge collection region 126 of photodiode 188. As explained in detail below, the barrier implanted regions 199, 299 are formed by implanting dopants of a first conductivity type at different energies and/or dosages below the isolation region 150 and in the bulk substrate 110. The barrier implanted regions 199, 299 are adjacent a dopant region of a second conductivity type of the photodiode 188, and they suppress leakage and dark current along bottom and sidewalls of isolation region 150 (FIGS. 10–11).

It should be noted that, although the invention will be described below in connection with use in a four-transistor (4T) pixel cell, the invention also has applicability to any CMOS imager including, for example, a three-transistor (3T) cell which differs from the 4T cell in the omission of a charge transfer transistor.

Figure 2:
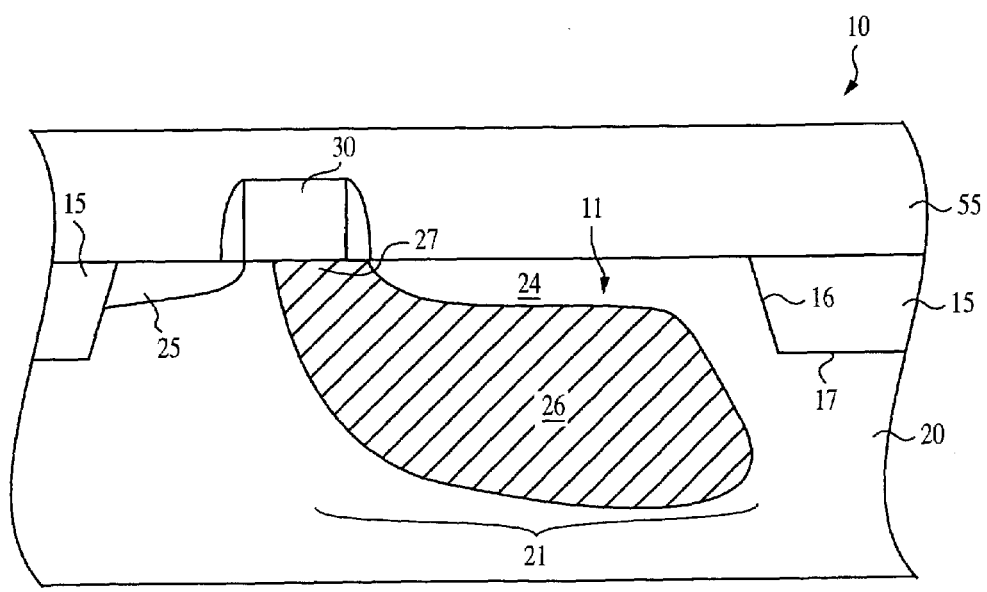
FIG. 2 is a schematic cross-sectional view of the CMOS image sensor of FIG. 1 taken along line 2–2'.
Figure 3:
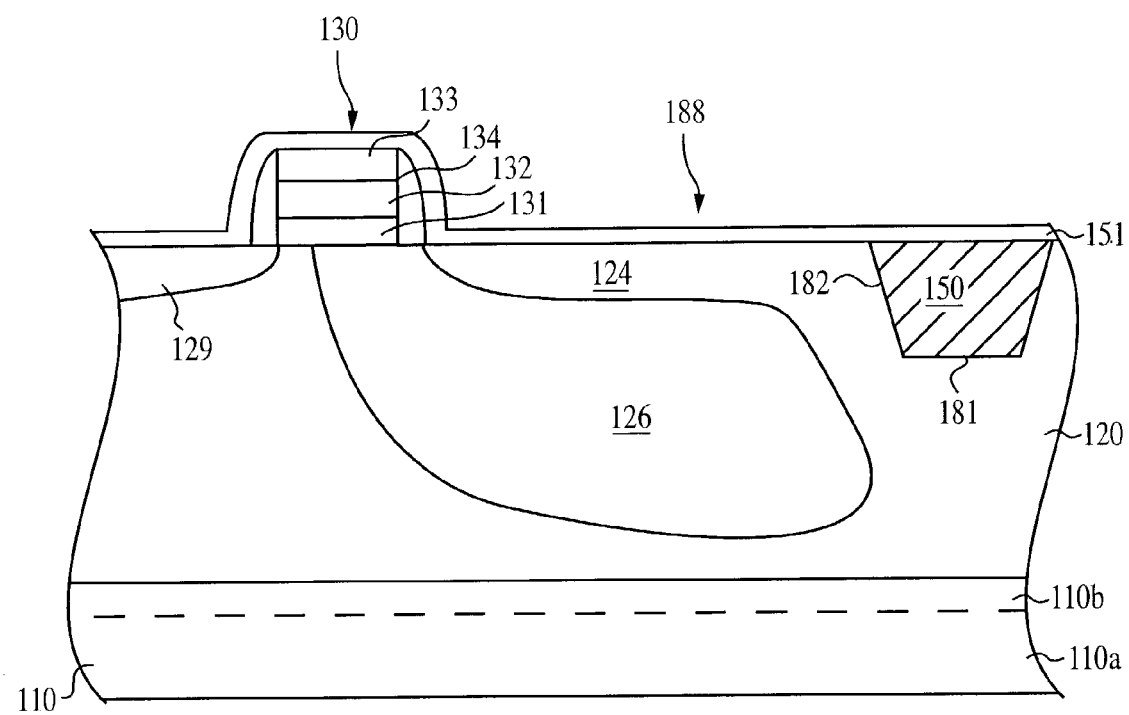
FIG. 3 is a schematic cross-sectional view of a CMOS image sensor pixel illustrating the fabrication of a photodiode in accordance with the present invention and at an initial stage of processing.

FIGS. 3–10 illustrate a substrate 110 along a crosssectional view which is the same view as in FIG. 2. For exemplary purposes, the substrate 110 is a silicon substrate. However, as noted above, the invention has equal applicability to other semiconductor substrates, for example, to an epitaxial layer supported by a base semiconductor. If a p+ epitaxial substrate layer is desired, a p-type epitaxial (epi) layer 110b (FIG. 3) is formed over a highly doped P+ substrate 110a, as illustrated in FIG. 3. The p-type epitaxial layer 110b may be formed to a thickness of about 2 microns to about 12 microns, more preferably of about 3 microns to about 7 microns, and may have a dopant concentration in the range of about $1 \times 10^{14}$ to about $5 \times 10^{16}$ atoms per cm$^3$, more preferably of about $5 \times 10^{14}$ to about $5 \times 10^{15}$ atoms per cm$^3$. The P+ substrate 110a is a highly doped substrate with an electrical resistivity of about 0.001 Ω-cm to about 1 Ω-cm, more preferably of about 0.01 Ω-cm to about 0.1 Ω-cm. Thus, although for simplicity the present invention will be described below with reference a silicon substrate 110, the invention has equal applicability to the formation of the barrier implanted regions 199, 299 by implanting dopants at different energies and/or dosages below the isolation region 150 and in a p-type well or doped layer formed within the p-type epitaxial layer 110b.

FIG. 3 also illustrates a multi-layered transfer gate stack 130 formed over the silicon substrate 110. The transfer gate stack 130 comprises a first gate oxide layer 131 of grown or deposited silicon oxide on the silicon substrate 110, a conductive layer 132 of doped polysilicon or other suitable conductor material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

If desired, a silicide layer (not shown) may be also formed in the multi-layered gate stack 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or WN$_x$/W or it could be entirely formed of WN$_x$. FIG. 3 also illustrates insulating sidewall spacers 134 formed on the sides of the transfer gate 130. The sidewall spacers 134 may be formed, for example, of silicon dioxide, silicon nitride, silicon oxynitride, ON, NO, ONO or TEOS, among others.

FIG. 3 also illustrates isolation region 150 which is formed within the substrate 110 and is filled with a dielectric material, which may be an oxide material, for example a silicon oxide such as SiO or SiO$_2$, a thermally grown oxide, oxynitride, a nitride material such as silicon nitride, silicon carbide, a high temperature polymer, or other suitable dielectric materials. The dielectric may be also formed of any combination of oxide/nitride, nitride/oxide and oxide/nitride/oxide materials. In a preferred embodiment, however, the isolation region 150 is a shallow trench isolation region and the dielectric material is a high density plasma (HDP) oxide, a material which has a high ability to effectively fill narrow trenches. Thus, for simplicity, reference to the isolation region 150 will be made in this application as to the shallow trench isolation region 150. The shallow trench isolation region 150 has a depth of about 1,000 to about 4,000 Angstroms, more preferably of about 2,500 Angstroms.

Although FIGS. 3–10 illustrate only a portion of the substrate 110 with only one shallow trench isolation region 150, it must be understood that the present invention contemplates the simultaneous formation of a plurality of shallow trench isolation structures at various locations on the substrate 110 to isolate the pixels one from another and to isolate other structures as well.

In addition, if desired, a thin insulating layer (not shown) may be formed on sidewalls 182 and bottom 181 (FIG. 3) of the shallow trench before the filling of the trench with the dielectric material which, as noted, is preferably a high density plasma (HDP) oxide. The thin insulating layer may be formed of an oxide or of silicon nitride or an oxide/nitride combination, for example, to aid in smoothing out the corners in the bottom of the trench and to reduce the amount of stress in the dielectric material used to later fill in the trenches. If a thermally grown oxide is desired as the thin insulating layer, then the thermally grown oxide may be of about 50 Angstroms to about 300 Angstroms, more preferably of about 100 Angstroms to about 200 Angstroms. Although the embodiments of the present invention will be described below with reference to a trench isolation structure without a thin insulating layer formed on its bottom and sidewalls, the invention is not limited to these embodiments, and also contemplates the formation of trench isolation structures which do comprise a thin insulating layer formed on the bottom and sidewalls.

Also illustrated in FIG. 3 is a p-n-p photodiode 188 formed by regions 124, 120 and 126. The p-type doped layer 120 is formed in the areas of the substrate 110 directly beneath the active area of the pixel cell by conducting a dopant implantation with a dopant of a first conductivity type, which for exemplary purposes is p-type. The p-type doped layer 120 may be formed subsequent to the formation of the shallow trench isolation (STI) 150 and of the gate stack 130. However, it must be understood that the p-type doped layer 120 may be also formed prior to the formation of the shallow trench isolation (STI) 150.

The n-type region 126 (FIG. 3) is formed by implanting dopants of a second conductivity type, which for exemplary purposes is n-type, in the area of the substrate directly beneath the active area of the pixel cell. The implanted n-doped region 126 forms a photosensitive charge storage region for collecting photo-generated electrons. Ion implantation may be conducted by placing the substrate 110 in an ion implanter, and implanting appropriate n-type dopant ions into the substrate 110 at an energy of 20 keV to 5 MeV to form n-doped region 126. N-type dopants such as arsenic, antimony, or phosphorus may be employed. The dopant concentration in the n-doped region 126 (FIG. 3) is within the range of about $1\times10^{15}$ to about $1\times10^{18}$ atoms per cm$^3$, and is preferably within the range of about $3\times10^{15}$ to about $1\times10^{17}$ atoms per cm$^3$.

The p-type pinned surface layer 124 is also formed by conducting a dopant implantation with a dopant of the first conductivity type, which for exemplary purposes is p-type, so that p-type ions are implanted into the area of the substrate over the implanted n-type region 126 and between the transfer gate 130 and shallow trench isolation region 150.

FIG. 3 also illustrates n-type floating diffusion region 129 located adjacent the multi-layered gate stack 130 and opposite the n-type doped region 126 of the p-n-p photodiode 188. This way, the multi-layered transfer gate stack 130 transfers charge accumulated in the charge collection region 126 of the photodiode 188 to the floating diffusion region 129.

Figure 4A:
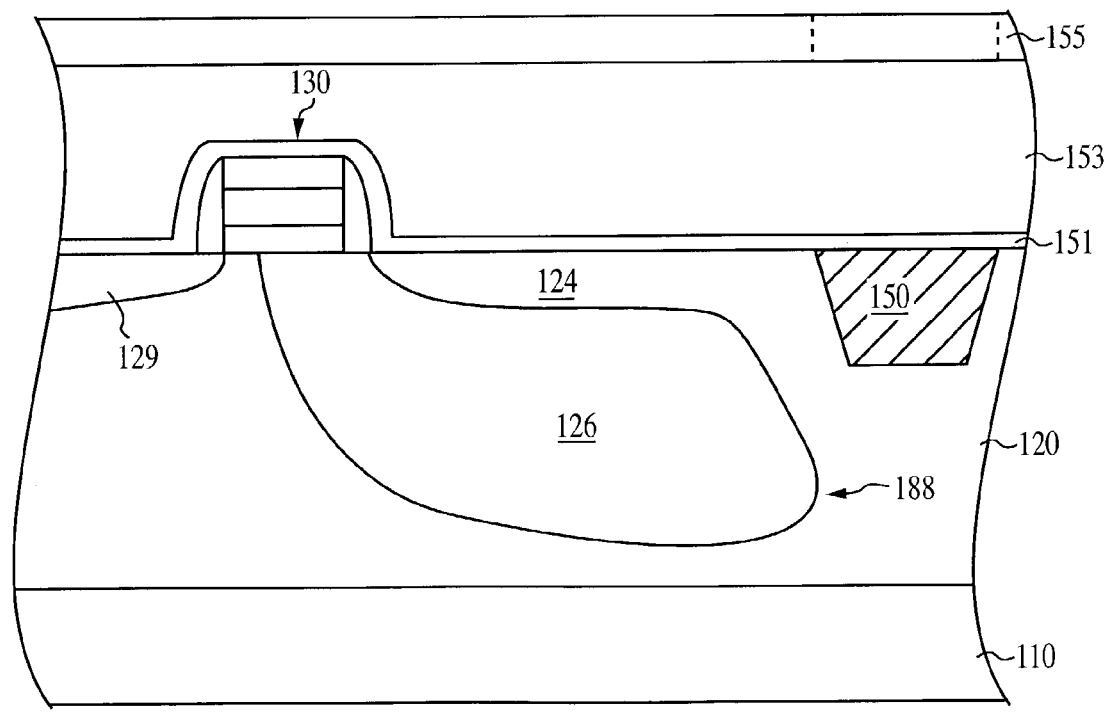
FIGS. 4(a)–(b) are schematic cross-sectional views of the CMOS image sensor fragment of FIG. 3 at a stage of processing subsequent to that shown in FIG. 3 and in accordance with various embodiments of the present invention.
Figure 4B:
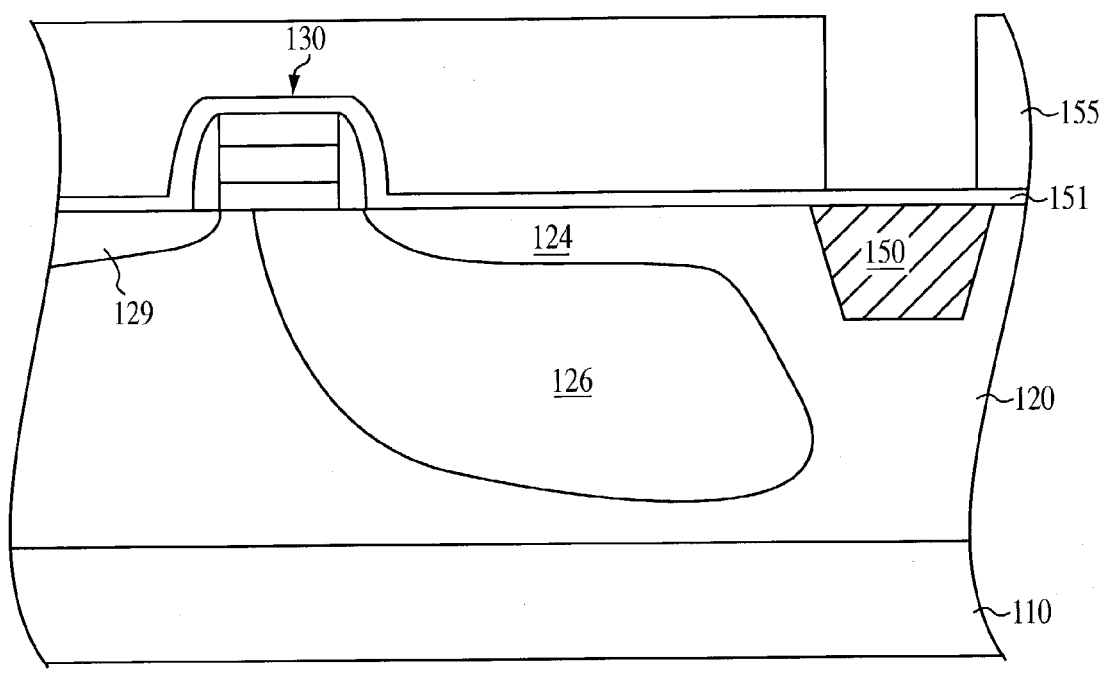
Figure 5B:
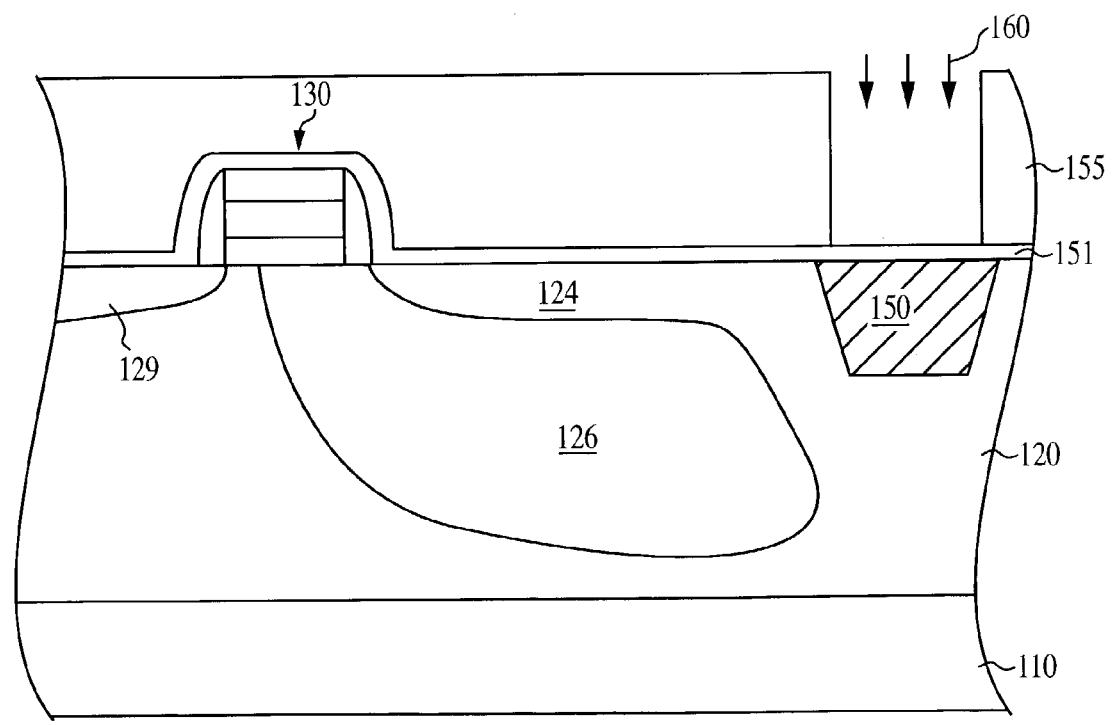
FIGS. 5(a)–(b) are schematic cross-sectional views of the CMOS image sensor pixel of FIG. 3 at a stage of processing subsequent to that shown in FIGS. 4(a)–(b).
Figure 5A:
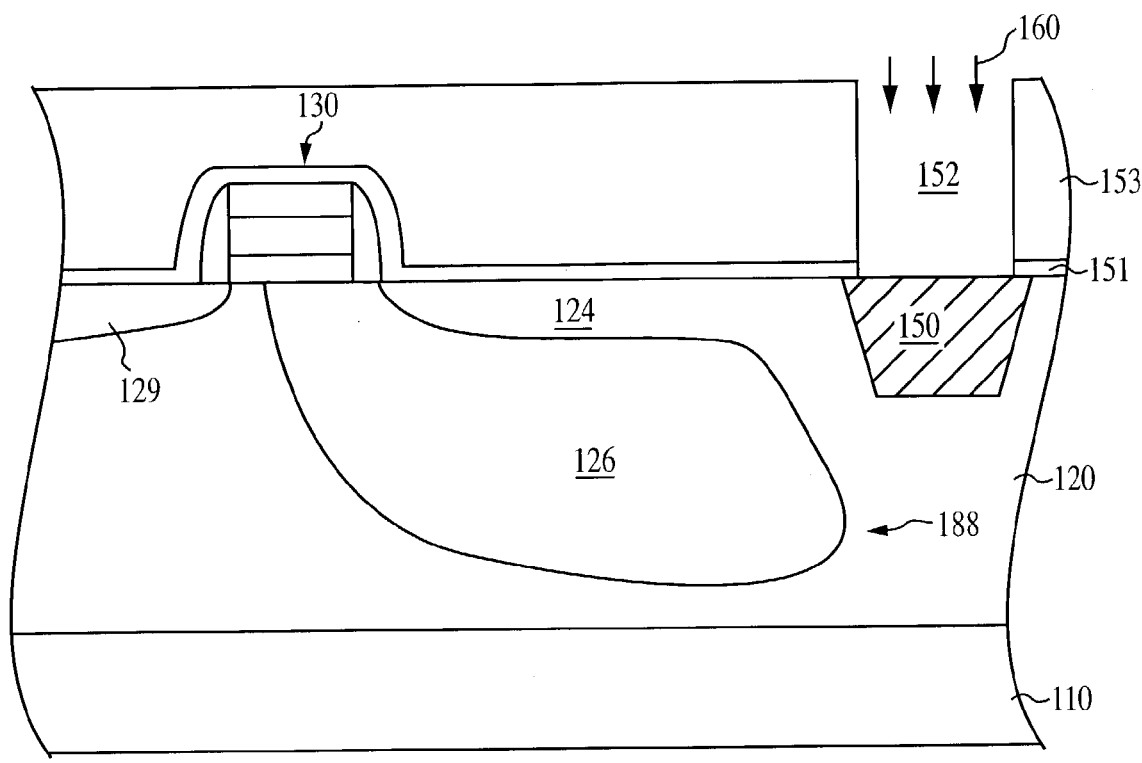

Referring now to FIG. 4(a), a blanket layer 153 of a hard mask material, such as silicon nitride or silicon oxide material, is formed over barrier oxide layer 151. The barrier oxide is typically a deposited oxide, such as TEOS or HDP oxide. A photoresisit layer 155 (FIG. 4(a)) is formed over the hard mask layer 153 and then patterned with a mask (not shown) and anisotropically etched to obtain opening 152 in layer 153, as illustrated in FIG. 5(a). The opening 152 is formed over the trench isolation region 150.

In an alternate embodiment, and as shown in FIGS. 4(b)–8(b), a thick photoresisit layer 155 of about 1.0 microns to about 5.0 microns is formed and patterned directly over the barrier oxide layer 151. In this embodiment, no blanket layer 153 is formed over the barrier oxide layer 151 and, thus, no etch is required. Although, for simplicity, the present invention will be described below with reference to FIGS. 4(a)–10(a) illustrating blanket oxide layer 153 formed over the barrier oxide layer 151, it must be understood that the invention has equal applicability to the embodiment illustrated in FIGS. 4(b)–10(b) with no blanket layer formed over the barrier oxide layer 151. Thus, the invention also contemplates the processing steps described with reference to FIGS. 4(b)–10(b) which differ from those described with reference to FIGS. 4(a)–10(a) only to the extent that photoresist layer 155 is formed and patterned directly over the barrier oxide layer 151 of FIGS. 4(b)–10(b).

Referring back now to the embodiment of FIG. 4(a), after the photoresist layer is formed, patterned and etched, the resulting structure, shown in FIG. 5(a) is subjected to a first dopant implantation 160 (FIG. 5(a)) with a dopant of the first conductivity type, which for exemplary purposes is p-type. This way, p-type ions are implanted through the opening 152 (FIG. 5(a)) to form a first p-type implanted isolation region 171 located adjacent and below the shallow trench isolation (STI) 150, as illustrated in FIG. 6(a).

The first dopant implantation 160 is conducted to implant p-type ions, such as boron, beryllium, indium or magnesium, into an area of the substrate 110 located right below the shallow trench isolation (STI) 150. The first dopant implantation 160 may be conducted by placing the substrate 110 in an ion implanter and implanting appropriate p-type dopant ions through the opening 152 (FIG. 5(a)) into the substrate 110 at an energy of 5 keV to about 50 keV, more preferably of about 10 keV, to form the first p-type implanted region 171. The dopant concentration in the first p-type implanted region 171 (FIG. 6(a)) is within the range of about $1\times10^{16}$ to about $5\times10^{18}$ atoms per cm$^3$, more preferably of about $1\times10^{17}$ atoms per cm$^3$.

Figure 6A:
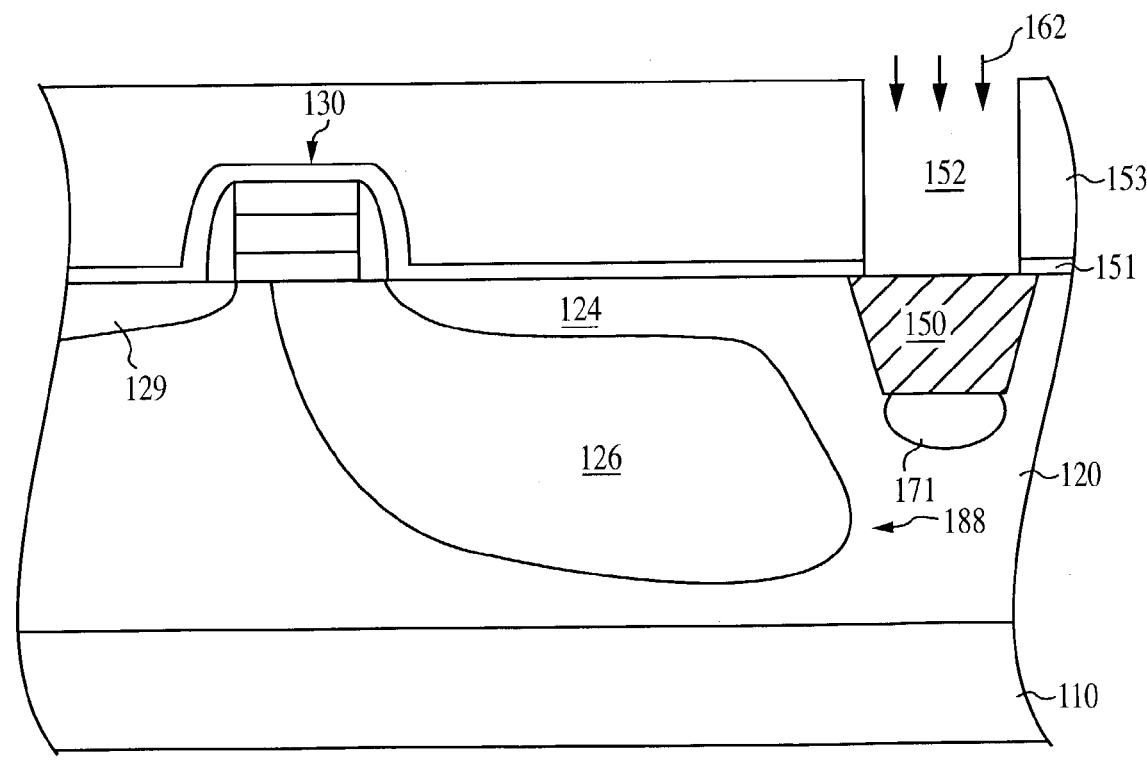
FIGS. 6(a)–(b) are schematic cross-sectional views of the CMOS image sensor pixel of FIG. 3 at a stage of processing subsequent to that shown in FIGS. 5(a)–(b).
Figure 6B:
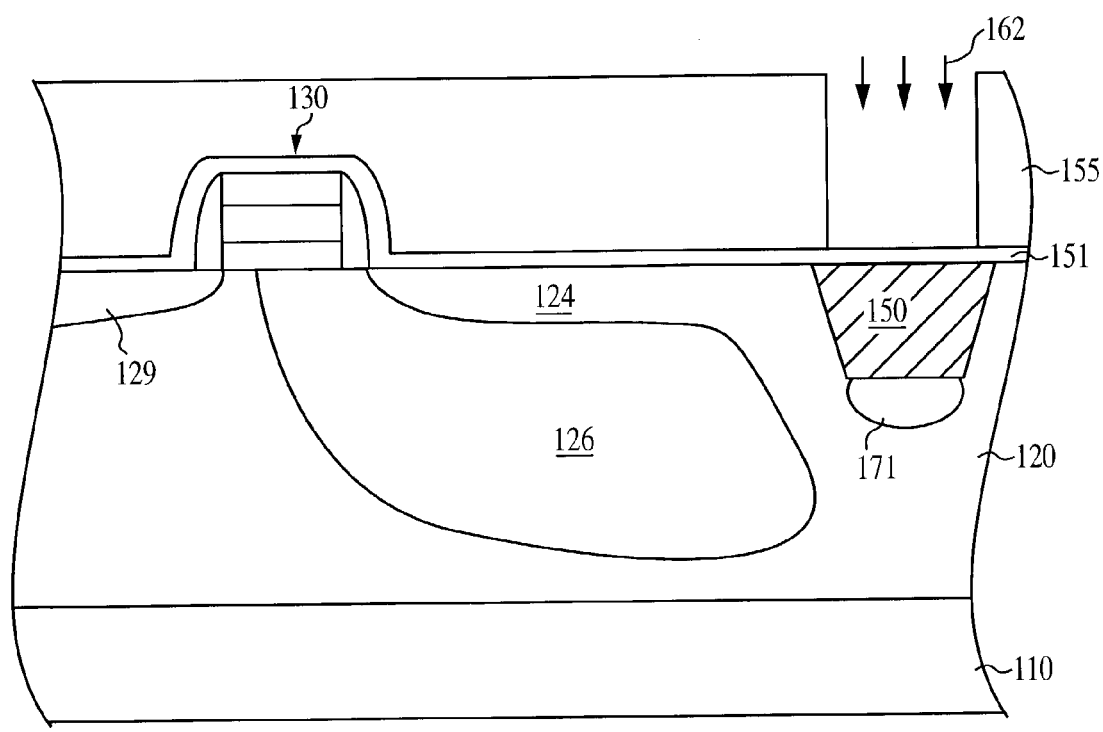
Figure 7B:
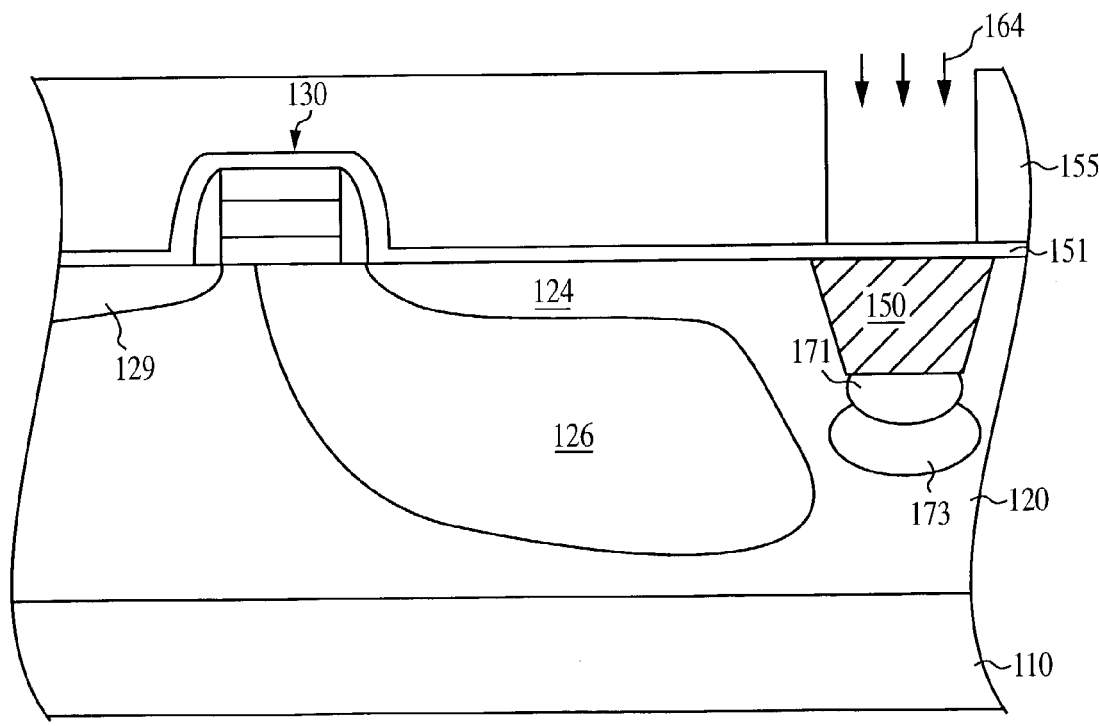
FIGS. 7(a)–(b) are schematic cross-sectional views of the CMOS image sensor pixel of FIG. 3 at a stage of processing subsequent to that shown in FIGS. 6(a)–(b).
Figure 7A:
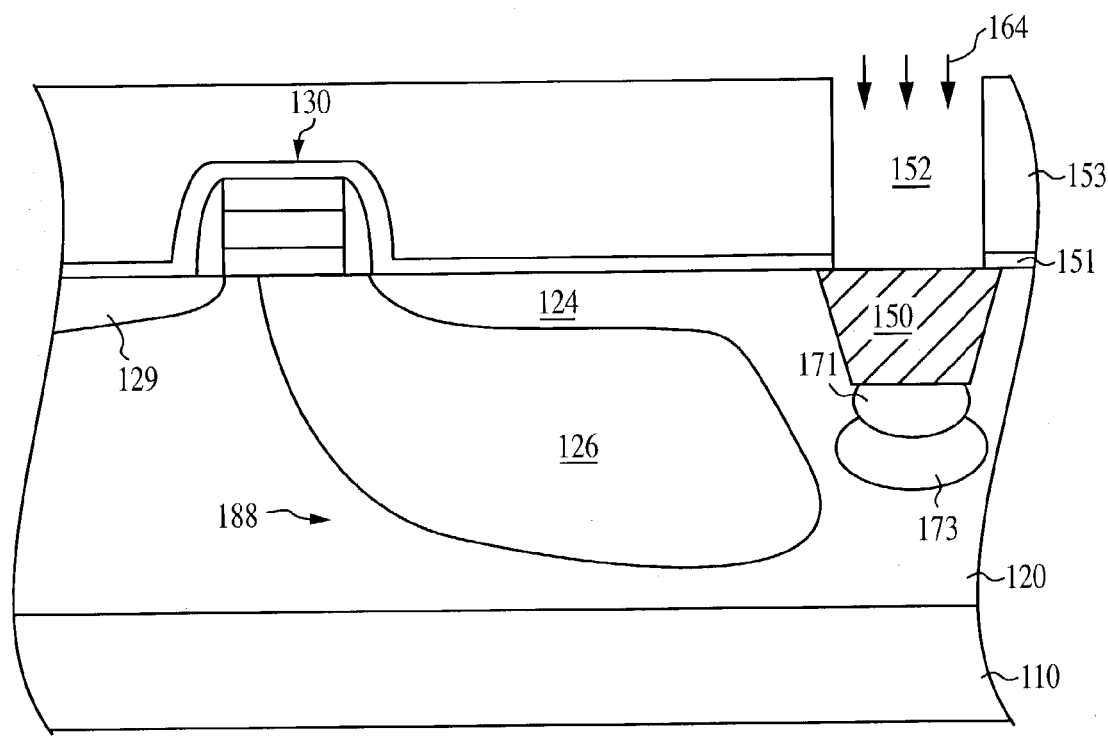

Next, the structure of FIG. 6(a) is subjected to a second dopant implantation 162 (FIG. 6(a)) with a dopant of the first conductivity type, which for exemplary purposes is p-type. This way, p-type ions are implanted through the opening 152 (FIG. 6(a)) to form a second p-type implanted isolation region 173 located adjacent and below the first p-type implanted region 171, as illustrated in FIG. 7(a).

The second dopant implantation 162 is conducted to implant p-type ions, such as boron, beryllium, indium or magnesium, into an area of the substrate 110 located below the shallow trench isolation region 150 and below the first implanted region 171. The second dopant implantation 162 may be conducted by placing the substrate 110 in an ion implanter and implanting appropriate p-type dopant ions through the opening 152 (FIG. 6(a)) into the substrate 110 at an energy of 10 keV to about 100 keV, more preferably of about 20 keV, to form the second p-type implanted isolation region 173. The dopant concentration in the second p-type implanted isolation region 173 (FIG. 7(a)) is within the range of about $1\times10^{16}$ to about $5\times10^{18}$ atoms per cm$^3$, more preferably of about $1\times10^{17}$ atoms per cm$^3$.

FIG. 8 illustrates yet a third p-type implanted isolation region 175 formed adjacent and below the second p-type implanted isolation region 173. For this, the structure of FIG. 7(a) is subjected to a third dopant implantation 164 (FIG. 7(a)) with a dopant of the first conductivity type, which for exemplary purposes is p-type. The third dopant implantation 164 is conducted to implant p-type ions, such as boron, beryllium, indium or magnesium, into an area of the substrate 110 located right below the shallow trench isolation (STI) 150. The third dopant implantation 164 may be conducted by placing the substrate 110 in an ion implanter and implanting appropriate p-type dopant ions through the opening 152 (FIG. 7(a)) into the substrate 110 at an energy of 20 keV to about 200 keV, more preferably of about 50 keV, to form the third p-type implanted isolation region 173. P-type dopants, such as boron, beryllium, indium or magnesium, may be employed for the third implant. The dopant concentration in the third p-type implanted isolation region 173 (FIG. 7(a)) is within the range of about $1\times10^{16}$ to about $5\times10^{18}$ atoms per cm$^3$, more preferably of about $1\times10^{17}$ atoms per cm$^3$.

The hard mask layer 153 is then removed by conventional techniques, such as wet or dry etching, to complete the formation of barrier implanted region 199 (FIG. 9(a)) comprising the first, second and third p-type implanted isolation regions 171, 173 and 175, respectively, and the formation of the pixel sensor cell 100 (FIG. 9(a)). Of course, for the embodiment of FIGS. 4(b)–9(b), after all implants are completed, the resist 155 (FIG. 8(b)) is stripped using an oxygen-containing plasma, for example, to complete the formation of barrier implanted region 199 (FIG. 9(b)) also comprising the first, second and third p-type implanted isolation regions 171, 173 and 175, respectively, and the formation of the pixel sensor cell 100 (FIG. 9(b)).

The barrier implanted region 199 of FIG. 9(a) acts as a reflective barrier to electrons generated by light in the n-doped region 126 of the p-n-p photodiode 188. When light radiation in the form of photons strikes the n-doped photosite region 126, photo-energy is converted to electrons which are stored in the n-doped region 126. The absorption of light creates electron-hole pairs. For the case of an n-doped photosite in a p-well, it is the electrons that are stored. For the case of a p-doped photosite in an n-well, it is the holes that are stored. Thus, in the exemplary embodiment described above having n-channel devices formed in the p-type well 120, the carriers stored in the n-doped photosite region 126 are electrons. The barrier isolation implanted region 199 located below the shallow trench isolation region 150 acts to reduce carrier loss to the substrate 110 by forming a concentration gradient that modifies the band diagram and serves to reflect electrons back towards the n-doped photosite region 126, thereby reducing cross-talk between adjacent pixel sensor cells.

In addition to providing a reflective barrier to electrons generated by light in the charge collection region, the barrier implanted region 199 provides photodiode-to-photodiode isolation, for example, isolation of the p-n-p photodiode 188 from an adjacent photodiode (not shown) located on the other side of the shallow trench isolation region 150.

In addition to providing a barrier region and photodiode-to-photodiode isolation, the barrier implanted region 199 also minimizes the formation of trap sites along the bottom 181 of the shallow trench isolation region 150, which become charged when electrons and holes become trapped in the trap sites and consequently affect the threshold voltage of the photodiode 188. As a result of minimizing the formation of these trap sites along the bottom 181 of the trench isolation regions 150, dark current generation and leakage near and along the trench bottom 181 is decreased.

Although FIGS. 3–9 illustrate barrier implanted isolation region 199 including only three implanted isolation regions 171, 173, 175 (FIGS. 9(a)–(b)), the invention is not limited to this embodiment and contemplates the formation of a barrier implanted isolation region comprising fewer or more of such deep implanted isolation regions. For example, FIGS. 10(a)–(b) illustrate another embodiment of the present invention according to which barrier implanted region 299 is formed by more than three deep implanted regions $170_1, 170_2, \ldots 170_i$ as part of a pixel sensor cell 200 (FIGS. 10(a)–(b)).

The deep implanted regions $170_1, 170_2, \ldots 170_i$ may be formed by placing the substrate 110 in an ion implanter and conducting a plurality "i" of implants and implanting appropriate p-type dopant ions through the opening 152 into the substrate 110. The number of implants and the dopant concentration of each of the "i" implants may be used to tailor the profile of the barrier implanted region 299 (FIGS. 10(a)–(b)).

Preferably, the number of implants and the dopant concentration of each implant may be tailored so that the sum of the depths of the shallow trench isolation 150 and of the barrier implanted region 299 is equal or greater than depth D (FIGS. 10(a)–(b)) of the p-type well 120 of the substrate 110. This way, one skilled in the art may tailor the dosage and implant energy of each of the "i" implants to form the deep implanted regions $170_1, 170_2, \ldots 170_i$ which act as a barrier to fully reflect electrons back toward the n-doped photosite region 126 and provide complete isolation of the photodiode 188 from adjacent photodiodes. The barrier implanted region 299 (FIGS. 10(a)–(b)) also "hooks-up" the substrate 110, which as described above may be a p+ epi layer, to the shallow trench isolation region 150 to minimize cross-talk and allow pixel scaling. Preferably, the depth D of the p-type well 120 of the substrate 110 may be of about 1000 Angstroms to about 5.0 microns, more preferably of about 2000 Angstroms to about 3.5 microns.

Figure 1:
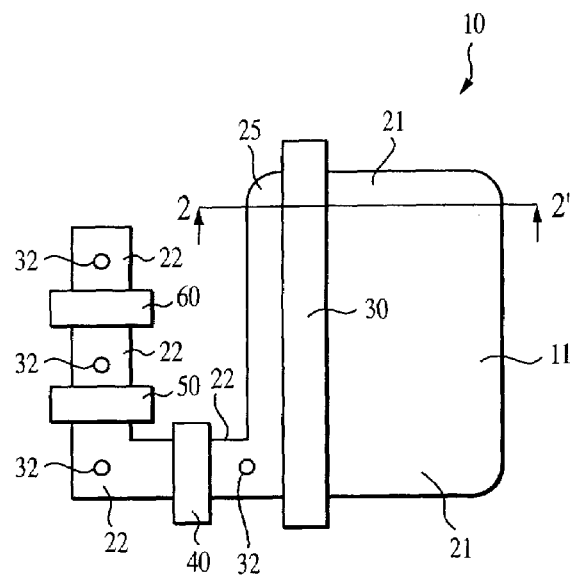
FIG. 1 is a top plan view of an exemplary CMOS image sensor pixel.

The remaining devices of the pixel sensor cell 100, 200, including the reset transistor, the source follower transistor and row select transistor shown in FIG. 1 as associated with respective gates 40, 50 and 60 and source/drain regions on either sides of the gates, are also formed by well-known methods. Conventional processing steps may be also employed to form contacts and wiring to connect gate lines and other connections in the pixel cell 100, 200. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

A typical processor based system 600, which has a connected CMOS imager 642 having pixels constructed according to the invention is illustrated in FIG. 11. A processor based system is exemplary of a system having digital circuits which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the above embodiments have been described with reference to the formation of a p-n-p photodiode, such as the p-n-p photodiode 188 (FIGS. 3–10) having a p-type deep implanted region 199, 299 formed by implantation below the bottom of a shallow trench isolation region, it must be understood that the invention is not limited to this embodiment. Accordingly, the invention has equal applicability to n-p-n photodiodes comprising an n-type deep implanted isolation region formed by implantation along the bottom of a shallow trench isolation region. Of course, the dopant and conductivity type of all structures will change accordingly, with the transfer gate corresponding to a PMOS transistor. Further, although the embodiments of the present invention have been described above with reference to a p-n-p photodiode, the invention also has applicability to n-p or p-n photodiodes.

In addition and as noted above, although the invention has been described with reference to the formation of only one shallow trench isolation region 150 having a deep implanted isolation region 199, 299 formed adjacent and below to it, the invention also contemplates the formation of a multitude of such shallow trench isolation regions, having corresponding deep implanted isolation region formed below them, located at various locations on the substrate to isolate pixels. Further, although the invention has been described above with reference to a transfer gate of a transfer transistor connection for use in a four-transistor (4T) pixel cell, the invention also has applicability to a three-transistor (3T) cell which differs from the 4T cell in the omission of a charge transfer gate 130, the formation of which was described above.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A pixel structure comprising:
   a substrate comprising a base substrate and a doped substrate, said doped substrate positioned directly above said base substrate;
   at least one isolation region formed within said doped substrate;
   an implanted region of a first conductivity type located below said at least one isolation region, said implanted region comprising at least one implanted isolation region, said implanted region connecting said at least one isolation region to base substrate; and
   a photosensor having a charge collection region of a second conductivity type that is complementary to the first conductivity type, formed adjacent but spaced from said isolation region such that charges emitted from the charge collection region are reflected by the at least one implanted isolation region.

2. The pixel structure of claim 1, wherein said photosensor is a photodiode.

3. The pixel structure of claim 1, wherein said photosensor is a photoconductor.

4. The pixel structure of claim 1, wherein said photosensor is a photogate.

5. The pixel structure of claim 1, wherein said at least one isolation region is an STI region.

6. The pixel structure of claim 1, wherein said at least one isolation region is a LOCOS region.

7. The pixel structure of claim 1, wherein said implanted isolation region is located along at least a portion of the bottom of said at least one isolation region.

8. The pixel structure of claim 1, wherein said implanted isolation region has a thickness of about 1000 Angstroms to about 5.0 microns.

9. The pixel structure of claim 8, wherein said implanted isolation region has a thickness of about 2000 Angstroms to about 3.5 microns.

10. The pixel structure of claim 1, wherein said implanted region comprises a plurality of implanted isolation regions located below said at least one isolation region.

11. The pixel structure of claim 10, wherein said implanted region comprises a first implanted isolation region located along the bottom of said isolation region, a second implanted isolation region located below said first implanted isolation region and a third implanted isolation region located below said second implanted isolation region.

12. The pixel structure of claim 11, wherein said first implanted isolation region is doped with a p-type dopant at a dopant concentration of from about $1\times10^{16}$ to about $5\times10^{18}$ atoms per $cm^3$.

13. The pixel structure of claim 12, wherein said first implanted isolation region is doped with a p-type dopant at a dopant concentration of about $1\times10^{17}$ atoms per $cm^3$.

14. The pixel structure of claim 11, wherein said second implanted isolation region is doped with a p-type dopant at a dopant concentration of from about $1\times10^{16}$ to about $5\times10^{18}$ atoms per $cm^3$.

15. The pixel structure of claim 14, wherein said second implanted isolation region is doped with a p-type dopant at a dopant concentration of about $1\times10^{17}$ atoms per $cm^3$.

16. The pixel structure of claim 11, wherein said third implanted isolation region is doped with a p-type dopant at a dopant concentration of from about $1\times10^{16}$ to about $5\times10^{18}$ atoms per $cm^3$.

17. The pixel structure of claim 16, wherein said third implanted isolation region is doped with a p-type dopant at a dopant concentration of about $1\times10^{17}$ atoms per $cm^3$.

18. The pixel structure of claim 1, wherein said isolation region comprises an HDP oxide.

19. The pixel structure of claim 1, wherein said isolation region is an STI region having a depth of about 1000 Angstroms to about 4000 Angstroms.

20. The pixel structure of claim 19, wherein said STI region has a depth of about 2000 Angstroms.

21. The pixel structure of claim 1, wherein said isolation region further comprises a thermally grown oxide.

22. The pixel structure of claim 21, wherein said thermally grown oxide is of about 50 Angstroms to about 300 Angstroms.

23. The pixel structure of claim 22, wherein said thermally grown oxide is of about 100 Angstroms to about 200 Angstroms.

24. The pixel structure of claim 1, wherein said isolation region comprises a material selected from the group consisting of oxide/nitride, nitride/oxide and oxide/nitride/oxide materials.

25. The pixel structure of claim 1, wherein said implanted isolation region is located within a p-type implanted region, said p-type implanted region being located within a p-type epitaxial substrate.

26. The pixel structure of claim 25, wherein said p-type epitaxial substrate comprises a p-type epitaxial layer formed over said base substrate. said base substrate being a P+ substrate.

27. The pixel structure of claim 26, wherein said p-type epitaxial layer is formed to a thickness of about 2 microns to about 12 microns.

28. The pixel structure of claim 27, wherein said p-type epitaxial layer is formed to a thickness of about 3 microns to about 7 microns.

29. The pixel structure of claim 26, wherein said P+ substrate has an electrical resistivity of about 0.001Ω-cm to about 1Ω-cm.

30. The pixel structure of claim 29, wherein said P+substrate has an electrical resistivity of about 0.01Ω-cm to about 0.1 Ω-cm.

31. The pixel structure of claim 1, wherein said first conductivity type is p-type and said second conductivity type is n-type.

32. The pixel structure of claim 1, wherein said first conductivity type is n-type and said second conductivity type is p-type.

33. The pixel structure of claim 1, wherein said photosensor is formed in a p-well to produce a p-n-p photosensor structure.

34. A shallow trench isolation structure for a pixel sensor cell, said shallow trench isolation structure comprising:
- an oxide material formed in a doped substrate to isolate said pixel cell; and
- an implanted region of a first conductivity type located in contact with at least a portion of said oxide material and with a base substrate positioned directly below said doped substrate, said first conductivity type being complementary to a second conductivity type of a charge collection region within said pixel cell such that charges emitted from the charge collection region are reflected by the implanted region.

35. The shallow trench isolation structure of claim 34, wherein said implanted region comprises at least one implanted isolation region of said first conductivity type.

36. The shallow trench isolation structure of claim 34, wherein said implanted region comprises a plurality of implanted isolation regions of said first conductivity type.

37. The shallow trench isolation structure of claim 36, wherein said implanted region comprises a first implanted isolation region, a second implanted isolation region and a third implanted isolation region of said first conductivity type.

38. The shallow trench isolation structure of claim 37, wherein said implanted region is doped with a p-type dopant.

39. The shallow trench isolation structure of claim 38, wherein said implanted region is doped with boron.

40. The shallow trench isolation structure of claim 37, wherein said first implanted isolation region is doped with a p-type dopant at a dopant concentration of from about $1 \times 10^{16}$ to about $5 \times 10^{18}$ atoms per cm$^3$.

41. The shallow trench isolation structure of claim 37, wherein said second implanted isolation region is doped with a p-type dopant at a dopant concentration of from about $1 \times 10^{16}$ to about $5 \times 10^{18}$ atoms per cm$^3$.

42. The shallow trench isolation structure of claim 37, wherein said third implanted isolation region is doped with a p-type dopant at a dopant concentration of from about $1 \times 10^{16}$ to about $5 \times 10^{18}$ atoms per cm$^3$.

43. The shallow trench isolation structure of claim 34, wherein said implanted region has a thickness of about 1000 Angstroms to about 5.0 microns.

44. The shallow trench isolation structure of claim 43, wherein said implanted region has a thickness of about 2000 Angstroms to about 3.5 microns.

45. The shallow trench isolation structure of claim 34, wherein said first conductivity type is p-type and said second conductivity type is n-type.

46. The shallow trench isolation structure of claim 34, wherein said first conductivity type is n-type and said second conductivity type is p-type.

47. The shallow trench isolation structure of claim 34, wherein said implanted region is located along the bottom of said oxide material.

48. The shallow trench isolation structure of claim 34, wherein said oxide material is a high density plasma oxide.

49. The shallow trench isolation structure of claim 34 further comprising a thermally grown oxide.

50. The shallow trench isolation structure of claim 49, wherein said thermally grown oxide is of about 50 Angstroms to about 300 Angstroms.

51. The shallow trench isolation structure of claim 50, wherein said thermally grown oxide is of about 100 Angstroms to about 200 Angstroms.

52. The shallow trench isolation structure of claim 34, wherein said oxide material is selected from the group consisting of oxide/nitride, nitride/oxide and oxide/nitride/oxide materials.

53. The shallow trench isolation structure of claim 34, wherein said charge collection region is a photodiode.

54. The shallow trench isolation structure of claim 34, wherein said charge collection region is a photogate.

55. The shallow trench isolation structure of claim 34, wherein said charge collection region is a photoconductor.

56. A pixel for use in an imaging device, said pixel comprising:
- a photosensor comprising a first doped layer of a first conductivity type formed in a doped substrate;
- a charge collection region formed in said first doped layer for accumulating photo-generated charge, said charge collection region being of a second conductivity type that is complementary to the first conductivity type, and being spaced from a barrier implanted isolation region of said first conductivity type, said barrier implanted isolation region being in contact with at least a portion of a shallow trench isolation region formed in said doped substrate and with a base substrate located directly below said doped substrate, the barrier implanted isolation region acting to reflect charges emitted from the charge collection region; and
- a second doped layer of said first conductivity type formed in said first doped layer and above said charge collection region.

57. The pixel of claim 56, wherein said charge collection region is adjacent a gate of a transfer transistor formed over said doped substrate, said transfer gate transferring charge accumulated in said charge collection region to a doped region of said second conductivity type.

58. The pixel of claim 56, wherein said barrier implanted isolation region is located along at least a portion of the bottom of said shallow trench isolation region.

59. The pixel of claim 56, wherein said barrier implanted isolation region comprises a plurality of implanted regions located below said shallow trench isolation region.

60. The pixel of claim 56, wherein said barrier implanted isolation region comprises a first implanted region, a second implanted region and a third implanted region of said first conductivity type.

61. The pixel of claim 60, wherein said first implanted region is doped with a p-type dopant at a dopant concentration of from about $1 \times 10^{16}$ to about $5 \times 10^{18}$ atoms per cm$^3$.

62. The pixel of claim 60, wherein said second implanted region is doped with a p-type dopant at a dopant concentration of from about $1 \times 10^{16}$ to about $5 \times 10^{18}$ atoms per cm$^3$.

63. The pixel of claim 60, wherein said third implanted region is doped with a p-type dopant at a dopant concentration of from about $1 \times 10^{16}$ to about $5 \times 10^{18}$ atoms per cm$^3$.

64. The pixel of claim 56, wherein said barrier implanted isolation region has a thickness of about 1000 Angstroms to about 5.0 microns.

65. The pixel of claim 64, wherein said barrier implanted isolation region has a thickness of about 2000 Angstroms to about 3.5 microns.

66. The pixel of claim 56, wherein said shallow trench isolation region comprises an HDP oxide.

67. The pixel of claim 56, wherein said shallow trench isolation region comprises a thermally grown oxide.

68. The pixel of claim 67, wherein said thermally grown oxide is of about 50 Angstroms to about 300 Angstroms.

69. The pixel of claim 68, wherein said thermally grown oxide is of about 100 Angstroms to about 200 Angstroms.

70. The pixel of claim 56, wherein said shallow trench isolation region comprises a material selected from the group consisting of oxide/nitride, nitride/oxide and oxide/nitride/oxide materials.

71. The pixel of claim 56, wherein said first conductivity type is p-type and said second conductivity type is n-type.

72. The pixel of claim 56, wherein said first conductivity type is n-type and said second conductivity type is p-type.

73. The pixel of claim 56, wherein said photosensor is a p-n-p photodiode.

74. The pixel of claim 56, wherein said photosensor is a photogate.

75. The pixel of claim 56, wherein said photosensor is a photoconductor.

76. A CMOS image sensor comprising:
a silicon substrate comprising a base substrate and a doped substrate, said doped substrate positioned directly above said base substrate;
a shallow trench isolation region formed within said doped substrate;
a p-type barrier implanted region located in contact with said shallow trench isolation region and said base substrate, said barrier implanted region having a thickness of about 1000 Angstroms to about 5.0 microns; and
a pixel adjacent said shallow trench isolation region comprising a photosensor, said photosensor further comprising an n-type doped layer adjacent and spaced from said p-type barrier implanted region such that electrons emitted from the photosensor are reflected by the p-type barrier implanted region.

77. The CMOS image sensor of claim 76, wherein said p-type barrier implanted region is located along the bottom of said shallow trench isolation.

78. The CMOS image sensor of claim 76, wherein said p-type barrier implanted region has a thickness of about 2000 Angstroms to about 3.5 microns.

79. The CMOS image sensor of claim 76, wherein said p-type barrier implanted region comprises a plurality of p-type doped regions.

80. The CMOS image sensor of claim 76, wherein said shallow trench isolation region comprises an HDP oxide.

81. The CMOS image sensor of claim 76, wherein said shallow trench isolation region comprises a thermally grown oxide.

82. The CMOS image sensor of claim 81, wherein said thermally grown oxide is of about 50 Angstroms to about 300 Angstroms.

83. The CMOS image sensor of claim 82, wherein said thermally grown oxide is of about 100 Angstroms to about 200 Angstroms.

84. The CMOS image sensor of claim 76, wherein said shallow trench isolation region comprises a material selected from the group consisting of oxide/nitride, nitride/oxide and oxide/nitride/oxide materials.

85. The CMOS image sensor of claim 76, wherein said photosensor is a p-n-p photodiode.

86. The CMOS image sensor of claim 76, wherein said photosensor is a photogate.

87. The CMOS image sensor of claim 76, wherein said photosensor is a photoconductor.

88. A CMOS imager system comprising:
a processor; and
a CMOS imaging device coupled to said processor, said CMOS imaging device comprising:
a shallow trench isolation region formed in a doped substrate;
an implanted isolation region of a first conductivity type located along the bottom of said shallow trench isolation and directly adjacent to a base substrate, said base substrate directly below said doped substrate; and
a pixel adjacent said shallow trench isolation region, said pixel comprising a photodiode adjacent a gate of a transfer transistor, said photodiode further comprising a pinned layer of said first conductivity type, and a doped region of a second conductivity type that is complementary to the first conductivity type, located below said pinned layer, said doped region being adjacent and spaced from said implanted isolation region such that charges emitted from the doped region of the second conductivity type are reflected by the implanted isolation region.

89. The system of claim 88, wherein said implanted isolation region has a thickness of about 1000 Angstroms to about 5.0 microns.

90. The system of claim 89, wherein said implanted isolation region has a thickness of about 2000 Angstroms to about 3.5 microns.

91. The system of claim 88, wherein said shallow trench isolation region comprises an oxide.

92. The system of claim 88, wherein said first conductivity type is p-type and said second conductivity type is n-type.

93. The system of claim 88, wherein said first conductivity type is n-type and said second conductivity type is p-type.

94. The system of claim 88, wherein said photodiode is a p-n-p photodiode.

* * * * *